US012770683B2

(12) United States Patent
Yang

(10) Patent No.: US 12,770,683 B2
(45) Date of Patent: Oct. 20, 2026

(54) MEMORY DEVICE BASED ON PHASE CHANGE MEMORY FOR DEEP NEURAL NETWORK AND METHOD FOR STORING WEIGHT THEREOF

(71) Applicant: UIF (University Industry Foundation), Yonsei University, Seoul (KR)

(72) Inventor: Joon-Sung Yang, Seoul (KR)

(73) Assignee: UIF (University Industry Foundation), Yonsei University, Seoul (KR)

( * ) Notice: Subject to any disclaimer, the term of this patent is extended or adjusted under 35 U.S.C. 154(b) by 330 days.

(21) Appl. No.: 18/508,745

(22) Filed: Nov. 14, 2023

(65) Prior Publication Data

US 2024/0161823 A1 May 16, 2024

(30) Foreign Application Priority Data

Nov. 14, 2022 (KR) ........................ 10-2022-0151360

(51) Int. Cl.
*G11C 13/00* (2006.01)
*G11C 11/54* (2006.01)

(52) U.S. Cl.
CPC ............ *G11C 13/004* (2013.01); *G11C 11/54* (2013.01); *G11C 13/0004* (2013.01)

(58) Field of Classification Search
CPC .................................................... G11C 13/004
See application file for complete search history.

(56) References Cited

U.S. PATENT DOCUMENTS 8,009,455 B2 * 8/2011 Lowrey .............. G11C 13/0035 365/163
10,643,705 B2 * 5/2020 Choi .................... G11C 13/004
11,526,285 B2 * 12/2022 Wang ...................... G06N 3/084
11,636,039 B2 * 4/2023 Rub .................... G06F 12/0873 711/119

(Continued)

FOREIGN PATENT DOCUMENTS

KR 10-2021-0075542 A 6/2021

OTHER PUBLICATIONS

T. -H. Nguyen, M. Imran and J. -S. Yang, "DynaPAT: A Dynamic Pattern-Aware Encoding Technique for Robust MLC PCM-Based Deep Neural Networks," 2022 IEEE/ACM International Conference on Computer Aided Design (ICCAD), San Diego, CA, USA, 2022, pp. 1-9.

*Primary Examiner* — Douglas King

(57) ABSTRACT

The present disclosure provides a PCM-based memory device for DNN and a method for storing weights thereof, the device comprising: a cell array having a plurality of memory cells implemented with phase change memories (Multi-Level Cell-Phase Change Memory, hereinafter PCM) that each store multi-bit data according to a resistance state level including a resistance value among a plurality of resistance state levels; and a memory controller that stores multi-bit data in the memory cells by mapping each bit pattern and the resistance state level, according to an appearance rate for bit patterns of a plurality of weights included in a plurality of layers constituting a DNN (Deep Neural Network). According to the present disclosure, fault tolerance can be improved by reducing the frequency of data errors due to resistance drift phenomenon.

18 Claims, 12 Drawing Sheets

(56) References Cited

U.S. PATENT DOCUMENTS

| | | | | |
|---|---|---|---|---|
| 11,769,046 | B2 * | 9/2023 | Cohen | G06N 3/065<br>706/25 |
| 11,805,713 | B2 * | 10/2023 | Cohen | H10N 70/063 |
| 2007/0104004 | A1 * | 5/2007 | So | B64C 27/006<br>365/203 |
| 2011/0302354 | A1 * | 12/2011 | Miller | G11C 16/22<br>711/E12.001 |
| 2011/0305075 | A1 * | 12/2011 | Lowrey | G11C 11/5678<br>365/163 |
| 2016/0253238 | A1 | 9/2016 | Strauss et al. | |
| 2021/0397974 | A1 * | 12/2021 | Hoang | G06N 3/063 |
| 2023/0036490 | A1 * | 2/2023 | Wang | G11C 11/54 |
| 2023/0210026 | A1 * | 6/2023 | Philip | H10B 63/00<br>257/4 |

* cited by examiner

MEMORY DEVICE BASED ON PHASE CHANGE MEMORY FOR DEEP NEURAL NETWORK AND METHOD FOR STORING WEIGHT THEREOF

CROSS-REFERENCE TO RELATED APPLICATIONS

This application claims priority under 35 U.S.C. § 119(a) to Korean Patent Application No. 10-2022-0151360, filed on Nov. 14, 2022, with the Korean Intellectual Property Office, the disclosure of which is incorporated herein in its entirety by reference.

BACKGROUND

1. Technical Field

The disclosed embodiments relate to a memory device and a method for storing weights thereof, and more particularly to a memory device based on phase change memory for a deep neural network and a method for storing weights thereof.

2. Description of the Related Art

Deep Neural Network (DNN), a type of machine learning (ML) technique, has recently been actively used in various fields such as computer vision, natural language processing, and big data analysis due to their higher efficiency and usability compared to existing programming approaches.

FIG. 1 shows a schematic structure of a DNN, and shows a structure of ResNet-18, one of the representative DNNs among DNNs.

As shown in FIG. 1, a DNN is generally composed of an input layer, an output layer, and a plurality of hidden layers located between the input layer and the output layer that perform neural network operations, each including a plurality of weights determined by learning. In order for such a DNN to perform neural network operations, it must be possible to store the weight of each layer and perform operations (convolution operation, pooling operation, etc.) according to the specified method on the input data or output data of the previous layer and the weight of each layer. Therefore, in order to utilize DNN, a large amount of computational resources as well as a large storage capacity for storing weights are required.

Therefore, in order to utilize DNN efficiently, high-density, low-power consumption, and performance-efficient memory technology is required. Previously, memory devices including charge-based memory devices such as DRAM and flash were mainly used for DNN, but these memory devices had problems such as limited scalability, power leakage, and increased vulnerability to defects, making them unsuitable for application to DNNs. Accordingly, the demand for new memory devices for DNN has increased, and recently, new non-volatile memories (NVMs), such as phase change memory (PCM), Resistive Random-Access Memory (ReRAM), and Spin-Transfer Torque Magnetic Memory (STT-MRAM), are attracting attention as memory devices for DNNs.

Among them, PCM is a memory device that stores data using a phase change material ($Ge_2Sb_2Te_5$: GST), and is known to be very suitable for DNN because it has high storage density, extendibility, and near-zero leakage power. PCM can distinguish stored data according to the level of resistance value that varies depending on the state of the changing phase. In addition, when the PCM is implemented as a memory cell of a memory device, the PCM can be implemented as a SLC (Single-Level Cell) that has two levels of resistance states, 0 or 1, and stores 1 bit of data, but it can also be implemented as an MLC (Multi-Level Cell), which has 4 resistance state levels and can store 2 bits of data, or a TLC (Triple-Level Cell), which has 8 resistance state levels and can store 3 bits of data. As such, when the PCM is implemented as an MLC-PCM or a TLC-PCM, which can store multi-bit data, it has the advantage of not only greatly increasing the data storage density of memory devices, but also reducing energy consumption by improving computational efficiency.

Meanwhile, recently, as very high performance and diverse functions are required for DNN, the structure of DNN is becoming very complex. It is known that the number of weights required for the recently proposed DNN has increased by more than 100 times compared to the previous one. Due to this increase in the size and complexity of the DNN structure, it is becoming difficult to apply DNN not only in computing environments with limited available resources such as mobile devices, IoT devices, and embedded systems, but also in general computing environments that are not equipped with high-performance computing devices and memory devices.

Accordingly, in order to utilize DNN in various environments, multi-bit PCM such as MLC-PCM or TLC-PCM is essential. However, multi-bit PCM is very vulnerable to resistance drift, where the resistance value changes over time, which can cause errors in stored data. Therefore, while SLC-PCM can be easily used as a memory device for DNN, multi-bit PCM, such as MLC-PCM or TLC-PCM, has a limitation in that it is difficult to use as a memory device for DNN.

STATEMENT REGARDING PRIOR DISCLOSURES BY THE INVENTOR OR A JOINT INVENTOR

At least one inventor or joint inventor of the present disclosure has made related disclosures in 2022 IEEE/ACM International Conference On Computer Aided Design (ICCAD), San Diego, CA, USA, on Nov. 2, 2022.

SUMMARY OF THE INVENTION

An object of the present disclosure is to provide a PCM-based memory device for DNN that can maintain high reliability despite data errors due to resistance drift phenomenon, and a method for storing weights thereof.

Another object of the present disclosure is to provide a PCM-based memory device for DNN and a method for storing weights thereof that can have high fault tolerance at low cost, by analyzing the ratio according to the frequency of appearance of the bit patterns that make up the weight in DNN and establishing a mapping relationship between the bit pattern of data stored in a memory cell implemented with a multi-bit PCM and the resistance state level.

A PCM-based memory device for DNN, according to an embodiment of the present disclosure, comprises: a cell array having a plurality of memory cells implemented with phase change memories (Multi-Level Cell-Phase Change Memory, hereinafter PCM) that each store multi-bit data according to a resistance state level including a resistance value among a plurality of resistance state levels; and a memory controller that stores multi-bit data in the memory cells by mapping each bit pattern and the resistance state level, according to an appearance rate for bit patterns of a plurality of weights included in a plurality of layers constituting a DNN (Deep Neural Network: hereinafter referred to as DNN).

The memory controller may sequentially map resistance state levels from a resistance state with the highest stability to a resistance state level with the lowest stability among the plurality of resistance state levels of the memory cell, in order from a bit pattern with the highest appearance rate to a bit pattern with the lowest appearance rate among the bit patterns that appear by segmenting each of the total weights of the DNN into multi-bits.

The memory controller may distinguish the bit patterns that appear by segmenting each of the total weights of the DNN into multi-bits, by bit position in the weights, and sequentially map resistance state levels from a resistance state level having the highest stability to a resistance state level having the lowest stability among the plurality of resistance state levels of the memory cell, in order from a bit pattern with the highest appearance rate to a bit pattern with the lowest appearance rate in a bit pattern of the most significant bit position among bit patterns segmented by bit position.

The memory controller may distinguish the bit patterns that appear by segmenting each of the total weights of the DNN into multi-bits, by bit position in the weights, map a bit pattern with the highest appearance rate in the bit pattern of the most significant bit position among the bit patterns classified by bit position to a resistance state level with the highest stability among the plurality of resistance state levels of the memory cell, and sequentially map a bit pattern with a high appearance rate among unmapped bit patterns in bit patterns of the next most significant bit position to a resistance state level with the next highest stability.

The memory controller may distinguish weights for each of the plurality of layers of the DNN, and map the bit patterns that appear by segmenting the distinguished weights of each layer into multi-bits to the resistance state levels independently for each layer, wherein it sequentially maps resistance state levels from a resistance state level having the highest stability to a resistance state level having the lowest stability among the plurality of resistance state levels of the memory cell in order from the bit pattern with the highest appearance rate to the bit pattern with the lowest appearance rate among the bit patterns.

The memory controller may distinguish weights for each of the plurality of layers of the DNN, distinguish the bit patterns that appear by segmenting the distinguished weights of each layer into multi-bits, by bit position in the weights, and map the bit patterns to the resistance state levels independently for each layer, wherein the memory controller sequentially maps resistance state levels from a resistance state level having the highest stability to a resistance state level having the lowest stability among the plurality of resistance state levels of the memory cell, in order from a bit pattern with the highest appearance rate to a bit pattern with the lowest appearance rate in a bit pattern of the most significant bit position among bit patterns segmented by bit position.

The memory controller may distinguish weights for each of the plurality of layers of the DNN, distinguish the bit patterns that appear by segmenting the distinguished weights of each layer into multi-bits, by bit position in the weights, and map the bit patterns to the resistance state levels independently for each layer, wherein the memory controller may map a bit pattern with the highest appearance rate in the bit pattern of the most significant bit position among the bit patterns classified by bit position to a resistance state level with the highest stability among the plurality of resistance state levels of the memory cell, and sequentially map a bit pattern with a high appearance rate among unmapped bit patterns in bit patterns of the next most significant bit position to a resistance state level with the next highest stability.

The memory controller may receive a plurality of weights included in the plurality of layers of the DNN, as well as auxiliary bits indicating the appearance rate for each bit pattern of the plurality of weights, and map the bit patterns and the resistance state levels based on the received auxiliary bits.

The memory controller may set the resistance state level with the highest resistance value range among the plurality of resistance state levels of the memory cell as the resistance state level with the highest stability, and set a resistance state level having a lower resistance value range as a resistance state level having higher stability within the range from the resistance state level with the lowest resistance value range to the resistance value range lower than the highest resistance value range.

The memory controller may check the resistance value of the memory cell, and when a resistance state level including the checked resistance value is determined, convert the resistance value into multi-bit data and output it according to a mapping relationship between the bit pattern and the resistance state level.

A method for storing weights of a PCM-based memory device for DNN, according to an embodiment of the present disclosure, is provided, in which the memory device comprises a cell array having a plurality of memory cells implemented with phase change memories (Multi-Level Cell-Phase Change Memory, hereinafter PCM) that each store multi-bit data according to a resistance state level including a resistance value among a plurality of resistance state levels and a memory controller, the method comprising the steps of: mapping each bit pattern and the resistance state level, by the memory controller, according to the appearance rate for bit patterns of a plurality of weights included in a plurality of layers constituting a Deep Neural Network (hereinafter DNN); and storing, by the memory controller, the multi-bit data as a resistance value according to the mapped resistance state level of the memory cell.

Accordingly, the PCM-based memory device for DNN and method for storing weights thereof, according to an embodiment of the present disclosure, analyses the ratio according to the frequency of appearance of the bit patterns that make up the weight in DNN, establishes a mapping relationship between the bit pattern of data stored in a memory cell implemented with multi-bit PCM and the resistance state level, and reads or writes data to multi-bit PCM according to the established mapping relationship, thereby maintaining high reliability even in the event of data errors due to resistance drift phenomenon. Accordingly, the memory device can have high fault tolerance at low cost, and when implemented with IMC, it can have high computational efficiency, thereby reducing energy consumption.

DETAILED DESCRIPTION OF THE INVENTION

Hereinafter, exemplary embodiments of the present disclosure will be described in detail with reference to the drawings. The following detailed description is provided to help comprehensive understanding of a method, an apparatus, and/or a system disclosed herein. However, this is merely exemplary, and the present disclosure is not limited thereto.

While describing the present disclosure, when it is determined that a detailed description of a known art related to the present disclosure may unnecessarily obscure the gist of the present disclosure, the detailed description will be omitted. Terms which will be used below are defined in consideration of functionality in the present disclosure, which may vary according to an intention of a user or an operator or a usual practice. Therefore, definitions thereof should be made on the basis of the overall contents of this specification. Terminology used herein is for the purpose of describing exemplary embodiments of the present disclosure only and is not intended to be limiting. The singular forms are intended to include the plural forms as well, unless the context clearly indicates otherwise. It should be understood that the terms "comprises," "comprising," "includes," and "including," when used herein, specify the presence of stated features, numerals, steps, operations, elements, or combinations thereof, but do not preclude the presence or addition of one or more other features, numerals, steps, operations, elements, or combinations thereof. Also, terms such as "unit", "device", "module", "block", and the like described in the specification refer to units for processing at least one function or operation, which may be implemented by hardware, software, or a combination of hardware and software.

Figure 2:
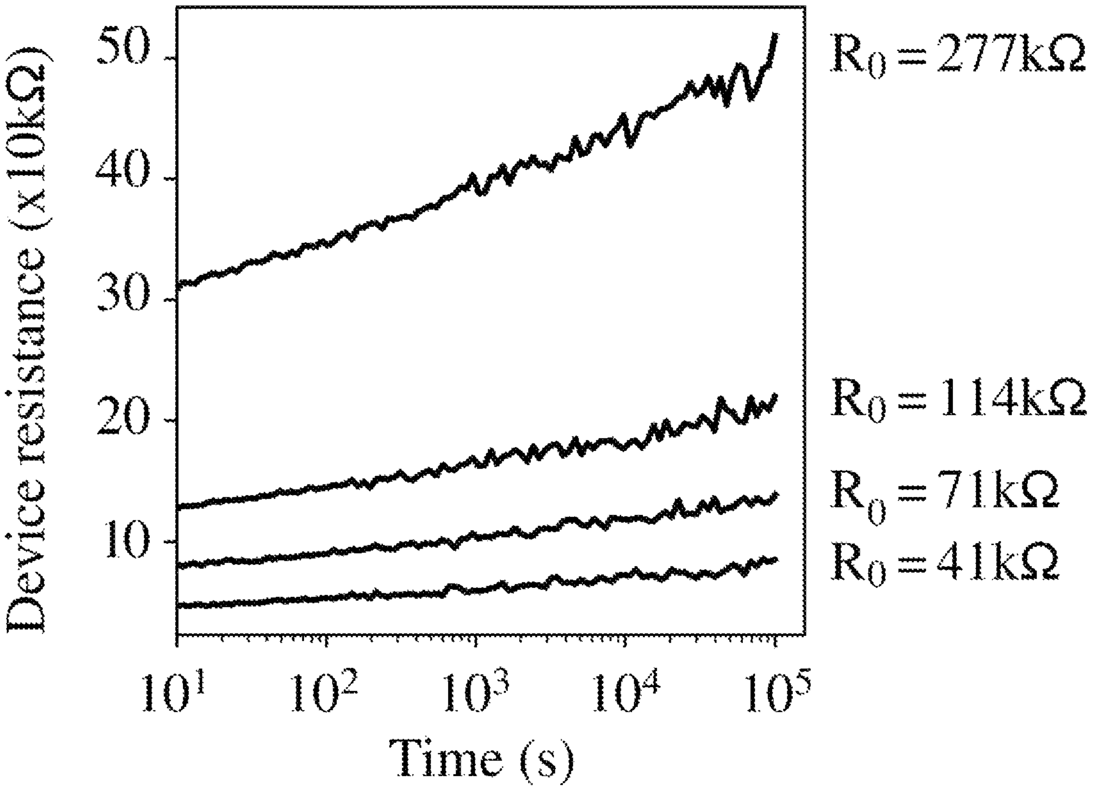
FIG. 2 is a diagram for explaining the resistance drift characteristics of MLC-PCM.
Figure 3:
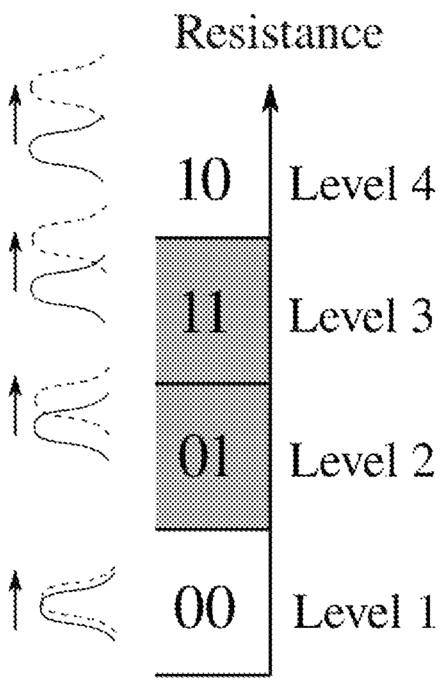
FIG. 3 is a diagram for explaining the error for each bit pattern according to resistance drift characteristics in MLC-PCM.

FIG. 2 is a diagram for explaining the resistance drift characteristics of MLC-PCM, and FIG. 3 is a diagram for explaining the error for each bit pattern according to resistance drift characteristics in MLC-PCM.

Referring to FIG. 2, MLC-PCM shows the change in resistance value over time when different initial resistance values ($R_0$) are set, and FIG. 3 shows, when the MLC-PCM is configured to store 2 bits of data by having a state corresponding to one of four resistance state levels (Level 1 to Level 4), bit patterns mapped to each of the four resistance state levels (Level 1 to Level 4) and bit value errors that may occur due to resistance drift.

As shown in FIG. 2, the resistance value ($R_0$) initially set in the MLC-PCM gradually increases over time, which is called a resistance drift phenomenon. The resistance drift phenomenon appears more significantly as the initially set initial resistance value ($R_0$) increases. The resistance value (R(t)) that changes due to the resistance drift phenomenon according to elapsed time (t) from the initial resistance value ($R_0$) set at the initial time ($t_0$) can be calculated as shown in Equation 1.

$$R(t) = R_0\left(\frac{t}{t_0}\right)^{\alpha} \quad \text{[Equation 1]}$$

(wherein α represents the resistance drift coefficient.)

As shown in FIG. 3, the MLC-PCM can have four resistance state levels (Level 1 to Level 4), and a corresponding bit pattern (or bit value) may be assigned and mapped to each of the resistance state levels (Level 1 to Level 4). Here, as an example, a case is shown where four bit patterns (00, 01, 11, 10) are respectively mapped to each of four resistance state levels (Level 1 to Level 4). The bit patterns (00, 01, 11, 10) of the MLC-PCM can be determined through comparison with a number of (here three) reference resistance values that distinguish the four mapped resistance state levels (Level 1 to Level 4). As an example, the bit patterns of the MLC-PCM can be determined by detecting the output current (or voltage) according to the voltage (or current) applied to the MLC-PCM, comparing the detected output current with a plurality of reference currents (or voltages) corresponding to a plurality of reference resistance values, and checking the resistance state level (Level 1 to Level 4) that includes the checked resistance value of the MLC-PCM.

Accordingly, if the set resistance value ($R_0$) gradually increases due to the resistance drift phenomenon and thus has a resistance value greater than the reference resistance value for the corresponding level, it is incorrectly determined that the bit value according to the bit pattern stored in the MLC-PCM has changed. In addition, when MLC-PCM is configured as a memory cell of a memory device for DNN, the increase in resistance value due to the resistance drift phenomenon causes the bit value stored in the memory cell to change over time, causing the DNN to perform incorrect calculations.

In particular, as shown in FIG. 2, the resistance drift phenomenon appears larger as the initially set initial resistance value ($R_0$) increases, so the resistance drift phenomenon appears in different sizes depending on the bit pattern (00, 01, 11, 10) of the weight stored in the MLC-PCM and the resistance state level mapped to each bit pattern.

As shown in FIG. 3, when the bit pattern (00) to which the first state level (Level 1) having the lowest resistance value range is mapped is stored in the MLC-PCM, the change in resistance value due to the resistance drift phenomenon is not large, so the possibility of an error in determining the bit value is very low. That is, no actual bit value discrimination error occurs. And, when the bit pattern (10) to which the fourth state level (Level 4) having the highest resistance value range is mapped is stored in the MLC-PCM, the change in resistance value appears the largest. However, in the MLC-PCM where the bit pattern (10) is stored, even if the resistance value increases due to the resistance drift phenomenon, there is no reference resistance value for determining a state level higher than the fourth state level (Level 4), so there is no possibility that the bit pattern (10) is misidentified as another bit pattern.

Therefore, misidentification of the bit pattern (or bit value) due to the resistance drift phenomenon mainly occurs in the bit patterns (01, 11) having a resistance value corresponding to the resistance range of the second and third state levels (Level 2, Level 3) in the MLC-PCM. In particular, it occurs most frequently in the bit pattern (11) corresponding to the third state level (Level 3), which has a resistance value range higher than the second state level (Level 2). That is, in MLC-PCM with four resistance state levels, bit value errors due to resistance drift are likely to occur in the following order: third state level (Level 3)>second state level (Level 2)>first state level (Level 1), and no bit value errors occur in the fourth state level (Level 4).

In other words, data stability is highest when the bit pattern (10) is stored in the MLC-PCM and has an initial resistance value ($R_0$) corresponding to the fourth state level (Level 4), and then data stability is high in the order of the first state level (Level 1), the second state level (Level 2), and data stability is lowest when the bit pattern (11) having an initial resistance value ($R_0$) corresponding to the third state level (Level 3) is stored.

Figure 4:
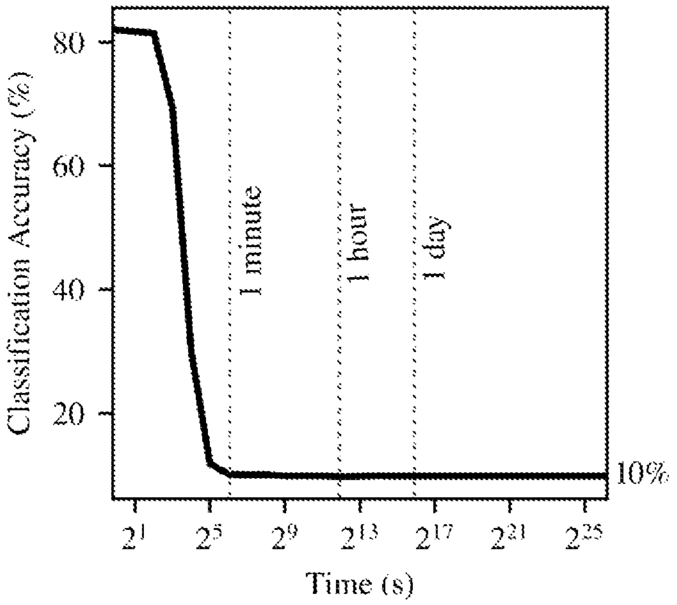
FIG. 4 shows the performance change of MLC-PCM based DNN over time.

FIG. 4 shows the performance change of MLC-PCM based DNN over time.

In FIG. 4, as an example, the change in performance of a DNN is shown that performs classification such as object identification or foreground/background segmentation, with MLC-PCM as a memory cell that stores the weights of a plurality of layers. In this case, as shown in FIG. 4, it can be seen that errors in data stored in MLC-PCM increase over time due to the resistance drift phenomenon, which significantly reduces classification accuracy.

Accordingly, in order to utilize MLC-PCM-based memory devices in DNN, data must be periodically re-stored and refreshed. However, refreshing to re-store data consumes energy, reducing the energy efficiency of DNN.

Meanwhile, in DNN, the plurality of weights change during the learning process, but after learning is completed, neural network operations are performed with weights according to the values determined by learning. In other words, when DNN is actually used in various devices, the weight value does not change. Therefore, when the weights of a DNN are stored in an MLC-PCM-based memory device, the memory device can check in advance the data to be stored in a plurality of memory cells implemented with MLC-PCM, that is, the distribution of the weights by bit pattern.

Figure 5:
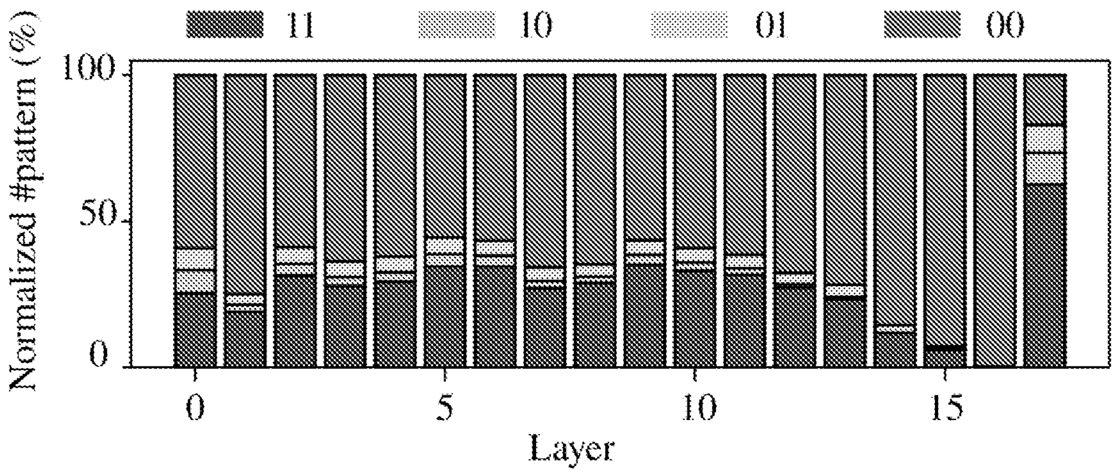
FIG. 5 shows the results of analyzing the bit pattern appearance rate of the weight for each layer of the DNN.

FIG. 5 shows the results of analyzing the bit pattern appearance rate of the weight for each layer of the DNN.

Figure 1:
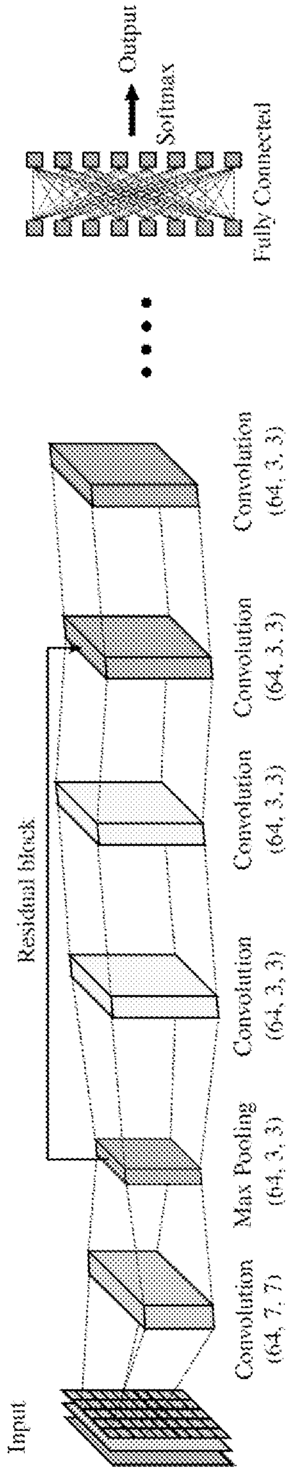
FIG. 1 shows a schematic structure of a DNN.

FIG. 5 shows the bit pattern distribution according to the results of each weight of ResNet-18 shown in FIG. 1 being quantized into 8-bit data and trained, and shows the bit pattern distribution analyzed for each layer. Since ResNet-18 includes 18 layers, FIG. 5 shows the bit pattern distribution according to a plurality of weights in each of the 18 layers (0 to 17).

Since the weights are quantized into 8-bit data, each weight can be composed of 4 bit patterns, each representing a 2-bit bit value. For example, if the 8-bit quantized weight is 0000110001, the 8-bit weight can be segmented into 4 bit patterns (00, 00, 11, 00, 01) by segmenting 2 bits each. If the weights are quantized into 16-bit data, each weight may be composed of 8 bit patterns.

Referring to FIG. 5, although there is a difference in the bit pattern distribution of the weight for each layer, it can be seen that among the four bit patterns (00, 01, 10, 11) in the entire DNN (ResNet-18), the appearance rate of bit pattern (00) is overwhelmingly higher than that of other bit patterns (01, 10, 11). In addition, it can be seen that among the remaining three bit patterns (01, 10, 11), the appearance rate is high in the order of bit pattern (11), bit pattern (01), and bit pattern (10).

The four bit patterns (00, 01, 10, 11) of MLC-PCM may be changed and mapped to the four state levels (Level 1 to Level 4) in various ways. In other words, as long as the mapping relationship between the four state levels (Level 1 to Level 4) and the four bit patterns (00, 01, 10, 11) can be confirmed, the bit pattern can be normally determined even if it is mapped differently from FIG. 3.

Therefore, in the embodiment, bit patterns with a high appearance rate are mapped to a state level with high stability, and bit patterns with a low appearance rate are mapped to a state level with low stability. This is to ensure that the memory device for DNN has fault tolerance by minimizing the number of memory cells in which bit value errors occur due to the resistance drift phenomenon over time.

As an example, if the DNN has the bit pattern distribution of FIG. 5, bit patterns, in order from bit patterns with the highest appearance rate (here (00)) to bit patterns with a low appearance rate (11→01→10), can be respectively mapped to the four state levels (Level 1 to Level 4) in order from the fourth state level (Level 4) to the first and second state levels (Level 1, Level 2) and the third state level (Level 3) according to the order of stability.

Figure 6:
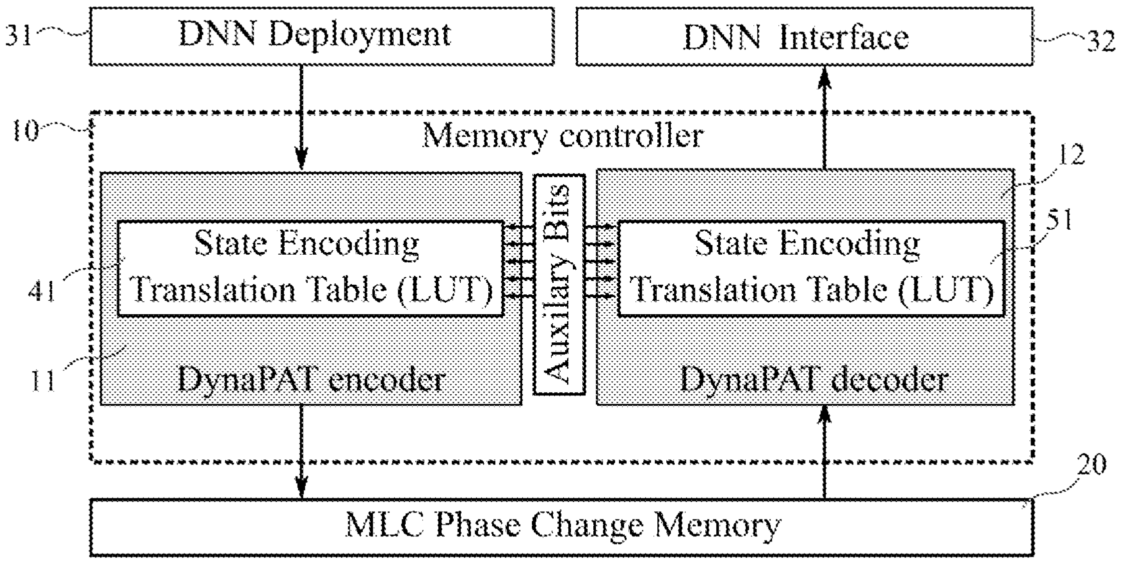
FIG. 6 shows a schematic structure of a memory device according to an embodiment.
Figure 7:
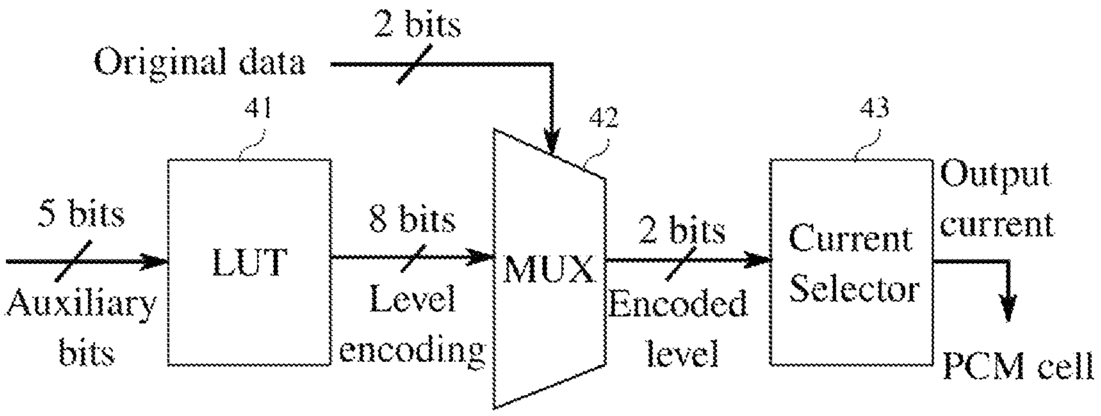
FIG. 7 shows an example of the detailed configuration of the encoder of FIG. 6.
Figure 8:
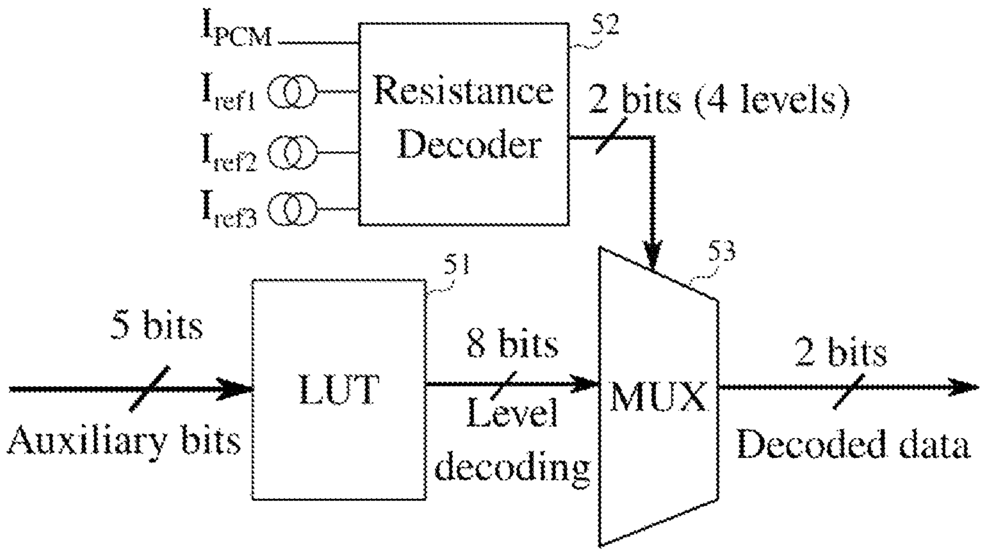
FIG. 8 shows an example of the detailed configuration of the decoder of FIG. 6.

FIG. 6 shows a schematic structure of a memory device according to an embodiment, FIG. 7 shows an example of the detailed configuration of the encoder of FIG. 6, and FIG. 8 shows an example of the detailed configuration of the decoder of FIG. 6.

Referring to FIG. 6, an MLC-PCM based memory device for DNN according to an embodiment may include a memory controller 10 and a cell array 20.

The cell array 20 includes a plurality of memory cells (not shown). Here, the plurality of memory cells can store data of bit positions designated in each of a plurality of weights provided in a plurality of layers of the DNN. In addition, each of the plurality of memory cells may be implemented with MLC-PCM, and store 2-bit data. Each of the memory cells implemented with MLC-PCM may have a resistance value mapped to the bit pattern of the 2-bit data to be stored among the 4 resistance state levels (Level 1 to Level 4), thereby storing 2-bit data of the location designated in the weight.

When weights for a plurality of layers constituting the DNN are applied from the DNN deployment module 31 that provides the trained DNN, the memory controller 10 stores the applied weights in a plurality of memory cells of the cell array 20, and transmits the weights stored in the plurality of memory cells of the cell array 20 to the interface module 32 for transmitting them to a device that performs a neural network operation using a DNN. In this case, the memory controller 10 of the embodiment may check a plurality of bit patterns for each of the plurality of applied weights, and cause the plurality of memory cells to have a resistance value of the resistance state level mapped to each checked bit pattern, thereby storing the weights in the memory cells. Then, by comparing the resistance value of each memory cell with a plurality of reference resistances to determine the resistance state level of each memory cell and obtaining a bit pattern mapped to the determined resistance state level, the weight can be restored and transmitted to the interface module 32.

Here, the DNN deployment module 31 may be an external device, and the weights of the trained DNN may be provided in the form of data stored in various storage media (not shown) or transmitted to the memory controller 10 through a communication module (not shown). In addition, in the embodiment, the DNN deployment module 31 may transmit a plurality of weights and auxiliary bits of the DNN together to the memory controller 10. In particular, the DNN deployment module 31 checks the appearance rate of bit patterns according to the weights determined in the DNN, in which learning has been completed and the weights of each label have been determined. When the appearance rate is checked, auxiliary bits indicating information about the checked appearance rate of the bit pattern can be transmitted to the memory controller 10 along with the weight of the DNN.

In some cases, the DNN deployment module 31 may also pre-map the resistance state level corresponding to each bit pattern according to the appearance rate of the bit pattern, and transmit information about the mapping relationship between the bit pattern and the resistance state level by including it in the auxiliary bit. In this case, the DNN deployment module 31 may map a bit pattern with a high appearance rate to a state level with high stability, and map a bit pattern with a low appearance rate to a state level with low stability.

The interface module 32 may be an interface to a separate external device, but may also be an interface that transmits data between the memory controller 10 and a processor (not shown) of a device that receives weights of DNN and performs neural network operations.

In the embodiment, the memory controller 10 may include an encoder 11 that determines the resistance state level mapped to the bit pattern of the weight and a decoder 12 that receives the resistance state level according to the resistance value of the memory cell and determines the mapped bit pattern.

When the memory controller 10 segments the applied weight into bit units of a size that can be stored in one memory cell (here, 2 bits) and obtains a plurality of bit patterns, the encoder 11 encodes each of the obtained plurality of bit patterns into a corresponding resistance state level. Accordingly, the memory controller 10 applies voltage (or current) according to the resistance state level encoded by the encoder 11 to the memory cells of the cell array 20 so that the memory cells have a resistance value according to the bit pattern.

Then, when the memory controller 10 applies a read voltage (or current) to the memory cell, detects the current (or voltage) output from the memory cell in response to the applied read voltage (or current), and determines the resistance state level according to the resistance value of the memory cell, the decoder 12 decodes the determined resistance state level to obtain a corresponding bit pattern. The memory controller 10 outputs the bit pattern obtained by the decoder 12 to a processor (not shown) or another device through the interface module 22.

At this time, the encoder 11 and decoder 12 may encode a bit pattern into a resistance state level or decode the resistance state level into a bit pattern by referring to state encoding translation tables 41 and 51 each configured in the form of a look-up table (LUT). The state encoding translation tables 41 and 51 can store the mapping relationships according to all possible combinations between the four resistance state levels (Level 1 to Level 4) and the four bit patterns (00, 01, 10, 11) that MLC-PCM can have. In addition, the state encoding translation tables 41 and 51 output one mapping relationship selected according to the auxiliary bit among several combinations of mapping relationships for the four resistance state levels (Level 1 to Level 4) and four bit patterns (00, 01, 10, 11), and the encoder 11 and decoder 12 encode each bit pattern into a corresponding resistance state level based on the output mapping relationship, or decode the resistance state level into the corresponding bit pattern.

As described above, the auxiliary bits contain information about the appearance rate of the bit pattern or mapping information between the bit patterns and the resistance state levels according to the appearance rate, so the encoder 11 and decoder 12 including the state encoding translation tables 41 and 51 can translate and output the bit patterns and resistance state levels based on the mapping relationship selected by the auxiliary bits.

Referring to FIG. 7, the encoder 11 may include a state encoding translation table 41, a MUX 42, and a current selector 43.

As described above, the state encoding translation table 41 receives auxiliary bits, and outputs level encoding data representing the resistance state level mapped to each of the four bit patterns according to the received auxiliary bits to the MUX 42. Here, since it is assumed that four bit patterns (00, 01, 10, 11) are mapped to four different resistance state levels (Level 1 to Level 4), the number of combinable mapping relationships is (4!=24), and, in order to select one of the mapping relationships according to 24 combinations, the auxiliary bit may be composed of 5-bit data. When 5 bits of auxiliary bits are applied, the state encoding translation table 41 applies level encoding data specifying four resistance state levels (Level 1 to Level 4) mapped to four bit patterns (00, 01, 10, 11) to the MUX 42. Here, the level encoding data may be, for example, 8-bit data with 2 bits allocated to each of four resistance state levels (Level 1 to Level 4). In the 8-bit level encoding data, each 2 bits designate one of four resistance state levels (Level 1 to Level 4), which can be referred to as encoding level data.

In addition, the MUX 42 receives the bit pattern of the original data obtained by segmenting each of the applied weights into 2-bit units by the memory controller 10, and selects the encoding level data selected by the bit patterns from the applied level encoding data and outputs it to the current selector 43.

The current selector 43 generates a write current corresponding to the encoding level data applied from the MUX 42 and applies it to the memory cell implemented with MLC-PCM, so that the memory cell has a resistance value within the resistance state level range mapped to the bit pattern. Here, the current selector 43 is shown as an example, but depending on the circuit structure of the cell array, it may be implemented as a voltage selector. In addition, although the current selector 43 is shown in FIG. 7 as being included in the encoder 11, the current selector 43 may not be included in the encoder 11 but may be included in the memory controller 10 separately.

Meanwhile, referring to FIG. 8, the decoder 12 may include a state encoding translation table 51, a resistance decoder 52, and a MUX 53.

The state encoding translation table 51 receives auxiliary bits, and outputs level decoding data representing the bit pattern mapped to each of the four resistance state levels (Level 1 to Level 4) according to the received auxiliary bits to the MUX 53. As an example, the level decoding data may also be 8-bit data with 2 bits allocated to each of four bit patterns (00, 01, 10, 11).

The resistance decoder 52 receives the current (or voltage) ($I_{PCM}$) output from the memory cell by the memory controller 10 applying a read voltage (or current) to the selected memory cell, compares the received current ($I_{PCM}$) with a plurality of reference currents (or voltages) ($I_{ref1}$ to $I_{ref3}$) set in response to a plurality of reference resistance values, determines the resistance state level containing the resistance value of the selected memory cell among four resistance state levels (Level 1 to Level 4), and outputs level determination data to the MUX 53.

The MUX 53 selects 2 bits from the level decoding data obtained from the state encoding translation table 51 according to the level determination data applied from the resistance decoder 52 and outputs them as decoded data.

In FIG. 8, for convenience of explanation, the resistance decoder 52 is shown as being included in the decoder 12. However, the resistance decoder 12 may be included in the memory controller 10 separately from the decoder 12.

Meanwhile, in FIGS. 6 to 8, the encoder 11 and the decoder 12 are shown as having separate state encoding translation tables 41 and 51, respectively. However, since the mapping relationship between the bit patterns and the resistance state levels must be applied equally at the time of encoding and decoding, the encoder 11 and decoder 12 may commonly use one state encoding translation table 41 and 51.

In addition, data of the state encoding translation tables 41 and 51 that store the mapping relationship between bit patterns and resistance state levels may be stored in a separate memory element that is separate from the memory cells of the cell array 20. The type of memory element for implementing the state encoding translation tables 41 and 51 provided in the memory controller 10 is not limited, but since data errors should not occur in the state encoding translation tables 41 and 51, the state encoding translation tables 41 and 51 may be implemented, for example, with SLC-PCM, a highly stable non-volatile memory device.

When the weights for a plurality of layers constituting the DNN are applied from the DNN deployment module 31 along with auxiliary bits containing information about the appearance rate of the bit pattern, the memory device described above selects one mapping relationship from the state encoding translation tables 41 and 51 that specify various mapping relationships between a plurality of bit patterns and a plurality of resistance state levels based on auxiliary bits, converts the bit pattern into a resistance state level, and converts the resistance state level into a bit pattern. At this time, by ensuring that a mapping relationship is selected in which bit patterns with a high appearance rate are mapped to a state level with high stability, and bit patterns with a low appearance rate are mapped to a state level with low stability, it reduces the number of data errors that occur due to resistance drift phenomenon in weights stored in a plurality of memory cells implemented with multi-bit PCM. In other words, the fault tolerance of the memory device can be improved.

In the above, it was explained that the DNN deployment module 31 calculates the appearance rate of the bit pattern to the total weight of the DNN and transmits the auxiliary bits, and accordingly, the memory controller 10 applies the mapping relationship between a plurality of bit patterns and a plurality of resistance state levels equally to all weights of the DNN.

As such, even if the same mapping relationship is applied to all weights of the DNN, the possibility of data errors can be greatly reduced. However, as shown in FIG. 5, the bit pattern appearance rate appears different in the weights of each of the plurality of layers in the DNN. In particular, it can be seen in FIG. 5 that the appearance rate of each bit pattern in the last 17th layer is very different from the appearance rate of bit patterns in the remaining 0th to 16th layers. That is, in the 0th to 16th layers, the bit pattern (00) has the highest appearance rate, followed by the bit patterns (11, 01, 10) in that order. However, in the 17th layer, the bit pattern (11) has the highest appearance rate, followed by the bit patterns (00, 01, 10) in that order.

Therefore, if the weights for all layers of the DNN are stored by translating the bit patterns into resistance state levels according to the same mapping relationship, the memory cell in which the weight of the 17th layer is stored is more likely to cause a data error due to resistance drift than the memory cells in which the weights of the other layers are stored. Therefore, a large number of calculation errors may occur concentrated in the 17th layer. Although the total number of weights in which data errors occur in DNN is reduced, data errors concentrated in specific layers can also have a significant impact on the calculation results.

Accordingly, in the embodiment, the DNN deployment module 31 may calculate the bit pattern appearance rate of the weight of the DNN separately for each layer and transmit the calculated bit pattern appearance rate for each layer by including it in the auxiliary bits. In addition, the memory device may convert a bit pattern into a resistance state level or a resistance state level into a bit pattern by applying an independent mapping relationship to each of the plurality of layers based on the auxiliary bits transmitted for each layer. In this case, the number of weights that cause data errors due to resistance drift phenomenon in each of the plurality of layers can be reduced, thereby further improving the defect resistance of the memory device.

However, since the mapping relationship may be specified differently for each layer, auxiliary bits representing information about the appearance rate of each bit pattern in each layer or the mapping relationship between the bit pattern and the resistance state level are required as many as the number of layers. However, as described above, the number of auxiliary bits for mapping the bit pattern for 2 bits of data and the 4 resistance state levels is very small, at the level of 5 bits. Therefore, even if the DNN deployment module 31 adds auxiliary bits for each layer with a plurality of weights, the amount of data added by the auxiliary bits is very small and does not significantly affect the load. As an example, as shown in FIG. 5, in the case of ResNet-18 with 18 layers, only 18×5=90 bits of data are added.

Figure 9:
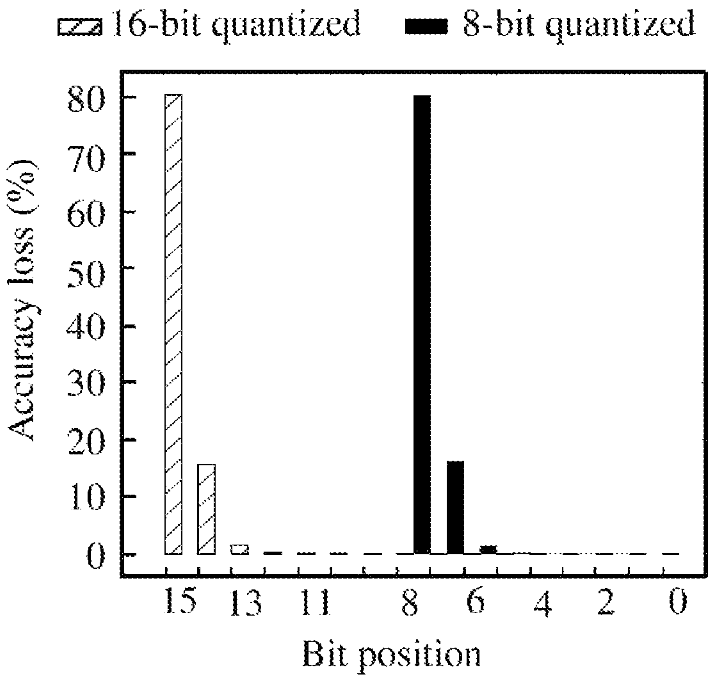
FIG. 9 shows accuracy loss for each bit position according to quantization level.

FIG. 9 shows accuracy loss for each bit position according to quantization level.

The weight value composed of a plurality of bits has different importance depending on the position of each bit. For example, as shown in FIG. 9, it can be seen that, when the weight is quantized to 8 or 16 bits, the accuracy loss due to an error in MSB (Most Significant Bit) is at the level of 80%, causing an absolute loss, while the impact of subsequent bits on the accuracy loss gradually becomes negligible as it moves to LSB (Least Significant Bit). And in the case of LSB, it can be seen that it actually has little effect on accuracy loss.

Therefore, a data error occurring in a bit pattern at a more significant bit position, among a plurality of bit patterns constituting the weight, causes a larger error in terms of accuracy of the actual weight than a plurality of data errors occurring in a bit pattern at a less significant bit position.

This means that, rather than simply changing the mapping relationship between the bit pattern of the weight included in the DNN and the resistance state level to reduce the number of bit patterns in which data errors occur in the entire DNN or the weights for each layer, it is important to consider the position of the bit pattern and reduce the number of data errors occurring in the bit pattern at the more significant bit position.

From this perspective, the DNN deployment module 31 of the embodiment can analyze the bit pattern appearance rate for each bit position in more detail rather than simply analyzing the bit pattern appearance rate for the entire DNN or the weight for each layer. As an example, the DNN deployment module 31 may segment and analyze the appearance rate for each bit position with respect to the overall weight of the DNN. In this case, the DNN deployment module 31 or the memory device may map the bit pattern that appears at the highest rate in the highest bit position to the resistance state level (here, as an example, the fourth level) with the highest stability according to the appearance rate for each analyzed bit position, and then sequentially map bit patterns that appear at a low rate to resistance state levels with low stability.

Figure 10:
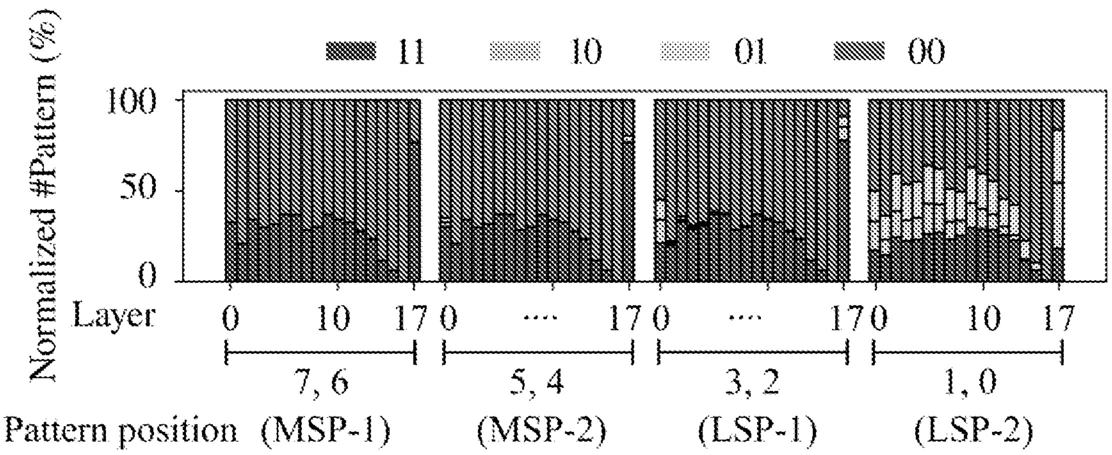
FIG. 10 shows the results of analyzing the bit pattern appearance rate for each bit position of the weight for a plurality of layers.

FIG. 10 shows the results of analyzing the bit pattern appearance rate for each bit position of the weight for a plurality of layers.

FIG. 10 is the result of analyzing the bit pattern appearance rate by bit position of ResNet-18, which has 18 layers (0 to 17), as in FIG. 5, and the bit pattern distribution is shown for each bit position of the weight quantized with 8-bit data.

Since it is assumed that the weight is quantized to 8 bits, each weight can be composed of 4 bit patterns with 2 bits each. In FIG. 10, the most significant bit position among the four bit patterns is referred to as MSP-1, the next most significant bit position is referred to as MSP-2, and the subsequent less significant bit position and the least significant bit position are referred to as LSP-1 and LSP-2, respectively.

In an embodiment, when the DNN deployment module 31 confirms the bit pattern appearance rate according to bit positions from the most significant bit position (MSP-1) to the least significant bit position (LSP-2) in each layer as shown in FIG. 10, the DNN deployment module 31 or the memory device may map a plurality of resistance state levels in order of high stability to low stability according to the bit pattern appearance rate according to the confirmed bit positions.

The DNN deployment module 31 or the memory device may perform mapping in various ways even when mapping a plurality of resistance state levels based on the bit pattern appearance rate according to the bit position in FIG. 10.

First, the DNN deployment module 31 or the memory device may map bit patterns and resistance state levels by considering only the bit pattern appearance rate shown in the most significant bit position (MSP-1), which has the greatest impact on accuracy in each layer. That is, the most significant bit position (MSP-1) is the representative bit position of the corresponding layer, that is, the bit pattern and resistance state level can be mapped according to the bit pattern appearance rate of the most significant bit position (MSP-1).

Second, similar to how DNN maps bit patterns and resistance state levels independently for each layer, the DNN deployment module 31 or the memory device may independently map bit patterns and resistance state levels in each layer shown in FIG. 10 according to the bit pattern appearance rate for each bit position. In this case, 4 auxiliary bits are required for each layer for a weight consisting of 8-bit data, and as a result, 18×5×4=360 bits of data can be used as auxiliary bits in a DNN such as ResNet-18.

Lastly, each bit pattern with the highest appearance rate can be sequentially mapped to the resistance state level from the most significant bit position (MSP-1) to the least significant bit position (LSP-2).

Figure 11:
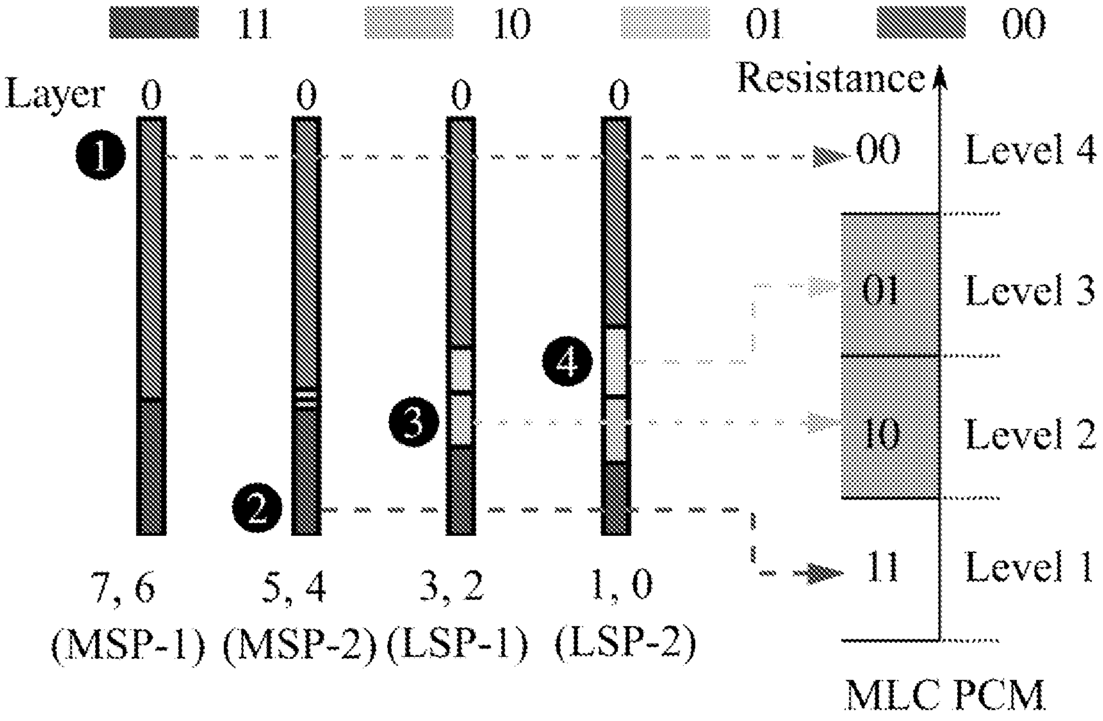
FIG. 11 is a diagram for explaining a method of sequentially mapping bit patterns to resistance state levels for each bit position.

FIG. 11 is a diagram for explaining a method of sequentially mapping bit patterns to resistance state levels for each bit position. FIG. 11 shows, as an example, a process in which each bit pattern (00, 01, 10, 11) is assigned to four resistance state levels (Level 1~Level 4) of MLC-PCM according to the bit pattern appearance rate for each bit position in the 0th layer (Layer 0) of ResNet-18.

Referring to FIG. 11, the DNN deployment module 31 first checks the bit pattern (here 00) with the highest appearance rate at the most significant bit position (MSP-1), and the DNN deployment module 31 or the memory device maps the checked bit pattern to the level with the highest stability (here, the fourth level) among the four resistance state levels (Level 1 to Level 4).

Then, it analyzes the bit pattern with the highest appearance rate in the next most significant bit position (MSP-2), identifies the bit pattern (11) with the highest appearance rate among the bit patterns that are not mapped to the resistance state level, and maps the identified bit pattern to the next highest stability level (here, the first level). In addition, the bit pattern with the highest appearance rate (here, 10) at the next bit position (LSP-1) is mapped to the level with the next highest stability (here, the third level).

That is, if the bit pattern with the highest appearance rate in the next most significant bit position (MSP-2) has already been mapped to a resistance state level due to the highest appearance rate in the previous more significant bit position (MSP-2), then the bit pattern with the next highest appearance rate is identified, and it is checked whether it is mapped to a resistance state level. And when an unmapped bit pattern is identified, the identified bit pattern is mapped to a resistance state level with the highest stability among the unmapped resistance state levels.

In this way, the DNN deployment module 31 or memory device may map the bit pattern with the highest appearance rate among the unmapped bit patterns and the resistance state level with the highest stability, sequentially from the most significant bit position (MSP-1) to less significant bit positions (MSP-2, LSP-1, LSP-2) in each layer, until all bit patterns are mapped to resistance state levels.

This method sequentially assigns the bit pattern with the maximum appearance rate at each bit position to the resistance state level with high stability in a weight composed of a plurality of bits, thereby reducing the possibility of data errors due to resistance drift phenomenon of memory cells implemented with multi-bit PCM at the more significant bit position and suppressing accuracy degradation. In addition, by also considering the bit pattern appearance rate at other bit positions, the possibility of data errors occurring in the entire layer can also be reduced, and the number of auxiliary bits required for each layer is also prevented from increasing.

As a result, in the PCM-based memory device for DNN according to the embodiment, when, in the DNN deployment module 31, the bit pattern appearance rate is analyzed from the overall weight of the DNN or the weight for each layer, and transmitted included in the auxiliary bits for the bit pattern appearance rate, the memory controller 10 of the memory device changes and encodes the mapping relationship between the bit pattern of the weight and the resistance state level according to the applied auxiliary bits and stores it in a memory cell implemented with a multi-bit PCM, or decodes the bit pattern according to the resistance value of the memory cell. In addition, in some cases, when the DNN deployment module 31 analyzes the bit pattern appearance rate for each bit position in the weight of each layer and transmits the auxiliary bits, encoding and decoding can be performed by changing the mapping relationship between the bit pattern for each bit position and the resistance state level according to the auxiliary bits. Therefore, the resistance state level with the highest stability is mapped starting from the bit pattern at the bit position that has a high appearance rate and has a large impact on data accuracy, and then the resistance state level with lower stability is sequentially mapped, so that the memory device has high fault tolerance even in the event of data errors due to resistance drift phenomenon, allowing it to maintain reliability. In addition, since the possibility of data errors occurring due to resistance drift phenomenon, which greatly increases over time, can be greatly reduced, energy consumption for data restorage can also be reduced by increasing data retention time.

Meanwhile, recently, in order to overcome the constraints of the von Neumann architecture, where the processor and memory are separated, and the processor reads the data stored in the memory and performs calculations, and which has limitations in improving energy efficiency and computation speed due to bottlenecks in data access and transmission, an In-Memory Computing (hereinafter: IMC) architecture that can maximize efficiency by performing calculations using memory that stores data has been proposed. Accordingly, when the memory device of the embodiment is implemented with IMC, computational accuracy can be increased due to excellent fault tolerance while having the high computational efficiency of IMC.

In the illustrated embodiment, respective configurations may have different functions and capabilities in addition to those described below, and may include additional configurations in addition to those described below.

The PCM-based memory device for DNN shown in FIG. 6 may be implemented in a logic circuit by hardware, firm ware, software, or a combination thereof, or may be implemented using a general purpose or special purpose computer. The device may be implemented using hardwired device, field programmable gate array (FPGA) or application specific integrated circuit (ASIC). Further, the device may be implemented by a system on chip (SoC) including one or more processors and a controller.

In addition, the PCM-based memory device for DNN may be mounted in a computing device or server provided with a hardware element as a software, a hardware, or a combination thereof. The computing device or server may refer to various devices including all or some of a communication device for communicating with various devices and wired/wireless communication networks such as a communication modem, a memory which stores data for executing programs, and a microprocessor which executes programs to perform operations and commands.

Figure 12:
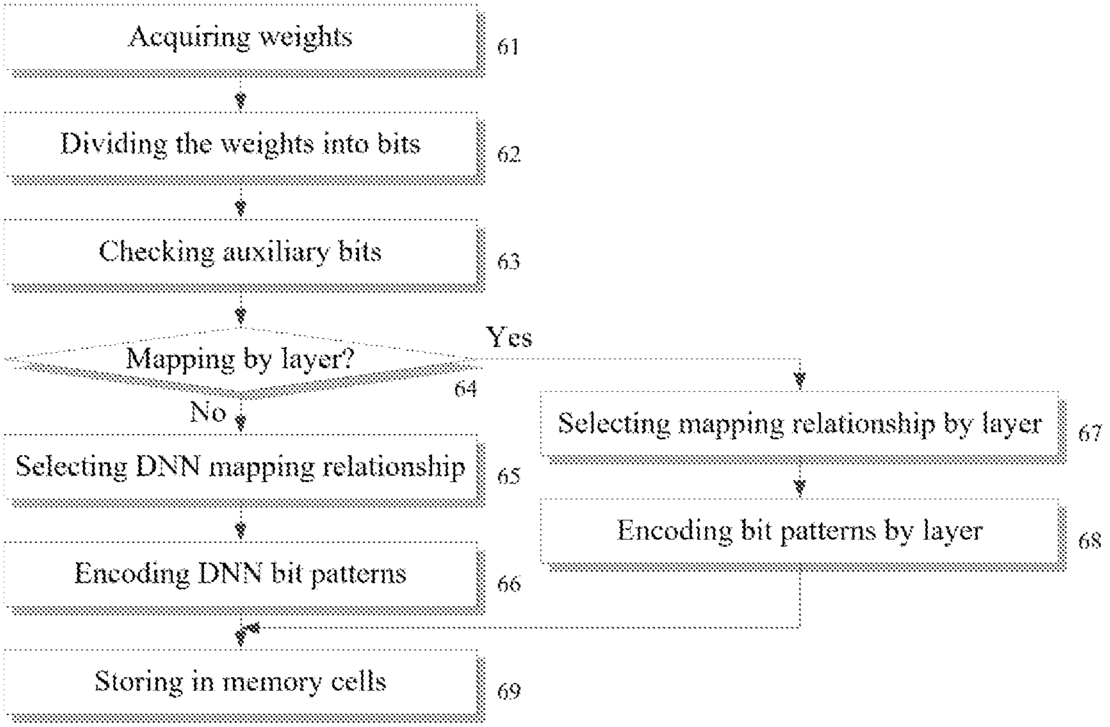
FIG. 12 shows a method for storing weights of a PCM-based memory device for DNN according to an embodiment.

FIG. 12 shows a method for storing weights of a PCM-based memory device for DNN according to an embodiment.

Referring to FIGS. 5 to 11 and explaining the weight storage method of FIG. 12, the memory device first acquires the weights included in each of the plurality of layers constituting the DNN (61). At this time, the weight may be quantized into a plurality of bits and applied, and can be obtained by being transmitted from the DNN deployment module 31 that deploys the trained DNN (62). In addition, when the weight is obtained, the auxiliary bits are applied together.

When the weight is applied, the weight quantized into a plurality of bits is segmented into the number of bits (here, 2 bits as an example) that can be stored in each of a plurality of memory cells implemented with multi-bit PCM in the memory device.

Then, the auxiliary bits to which the auxiliary bits are applied along with the weight are checked (63). Here, the auxiliary bits may include information according to the appearance rate of multi-bit bit patterns segmented from the weight. In some cases, the auxiliary bits may include a mapping relationship between a bit pattern and a resistance state level that distinguishes bit values in a memory cell according to the appearance rate. In addition, the auxiliary bits may represent the bit pattern appearance rate (or mapping relationship) for the entire weight of the DNN, or may represent the bit pattern appearance rate (or mapping relationship) for the weight for each of a plurality of layers of the DNN.

Accordingly, it is determined whether the transmitted auxiliary bits are auxiliary bits for the entire weight of the DNN or auxiliary bits for the weight of each layer (64). If the auxiliary bits are determined to be auxiliary bits for the weight of the entire DNN, a mapping relationship between the bit pattern for the weight of the entire DNN and the resistance state level is selected based on the information obtained from the auxiliary bits (65). At this time, the mapping relationship between bit patterns and resistance state levels may be selected so that the resistance state levels from the resistance state level with the highest stability to the resistance state level with the lowest stability among a plurality of resistance state levels of multi-bit PCM are mapped in the order from the bit pattern with the highest appearance rate to the bit pattern with the lowest appearance rate among the bit patterns that appear separately from the overall weight of the DNN.

Otherwise, the mapping relationship may be selected so that the resistance state levels from the resistance state level with the highest stability to the resistance state level with the lowest stability are mapped in the order from the bit pattern with the highest appearance rate to the bit pattern with the lowest appearance rate in the bit pattern at the most significant bit position among the bit patterns that appear separately from the overall weight of the DNN.

In addition, the mapping relationship may be selected so that a bit pattern with a high appearance rate in the bit patterns at the most significant bit position is first mapped to a resistance state with high stability, and then sequentially, a bit pattern with a high appearance rate among unmapped bit patterns at the next bit position is mapped to a resistance state level with the next stability.

Then, bit patterns segmented from all weights of the DNN applied according to the selected mapping relationship are encoded into mapped resistance state levels (66).

On the other hand, if the auxiliary bits are determined to be auxiliary bits for the weight for each layer, the mapping relationship between the bit pattern for the weight and the resistance state level for each layer is selected, based on the information of the auxiliary bits obtained for each layer (67).

The mapping relationship between the bit pattern and the resistance state level for the weight of each layer may also be selected in one of several ways, similar to the mapping relationship for the weight of the DNN.

That is, the mapping relationship may be selected such that the resistance state levels from the resistance state level with the highest stability to the resistance state level with the lowest stability among a plurality of resistance state levels of multi-bit PCM are mapped in the order from the bit pattern with the highest appearance rate to the bit pattern with the lowest appearance rate among the bit patterns in the weights at each layer.

Otherwise, the mapping relationship may be selected such that the resistance state levels from the resistance state level with the highest stability to the resistance state level with low stability are mapped in the order from the bit pattern with the highest appearance rate to the bit pattern with the lowest appearance rate in the bit pattern at the most significant bit position among the bit patterns that appear segmented in the weight of each layer.

In addition, the mapping relationship may be selected such that a bit pattern with a high appearance rate in the bit patterns at the most significant bit position of the weight for each layer is first mapped to a resistance state with high stability, and then sequentially, a bit pattern with a high appearance rate among unmapped bit patterns at the next bit position is mapped to a resistance state level with the next stability.

Then, the bit patterns segmented in the weight for each layer applied according to the selected mapping relationship are encoded into the mapped resistance state level (68).

Once the bit patterns of the weights are encoded into resistance state levels according to the selected mapping relationship, the memory controller 10 of the memory device applies voltage (or current) according to the resistance state level to the memory cell, causes the memory cell to have a resistance value corresponding to the bit pattern, and stores multi-bit values according to the bit pattern in the memory cell (69).

Although not shown, when trying to obtain weights of DNN by receiving multi-bit values stored in memory cells, voltage (or current) is first applied to the memory cell to check the resistance value of the memory cell, and the resistance state level containing the checked resistance value is determined. Then, the bit patterns mapped to the determined resistance state levels can be determined using the already obtained auxiliary bits, and the weights can be restored by combining the determined bit patterns.

In FIG. 12, it is described that the respective processes are sequentially executed, which is, however, illustrative, and those skilled in the art will be able to make various modifications and transformations and apply the modifications and transformations by executing the steps by changing an order described in FIG. 12, executing one or more processes in parallel, or adding other processes without departing from an essential characteristic of the exemplary embodiment of the present disclosure.

Although the present disclosure has been described in detail through representative embodiments above, those skilled in the art will understand that many modifications and other equivalent embodiments can be derived from the embodiments described herein. Therefore, the true technical scope of the present disclosure is to be defined by the technical spirit set forth in the appended scope of claims.

What is claimed is:

1. A phase change memory (PCM)-based memory device for deep neural network (DNN), comprising:

a cell array having a plurality of memory cells implemented with phase change memories, wherein each of the plurality of memory cells stores multi-bit data according to a resistance state level including a resistance value among a plurality of resistance state levels; and a memory controller that stores multi-bit data in the memory cells by mapping each bit pattern and the resistance state level, according to an appearance rate for bit patterns of a plurality of weights included in a plurality of layers constituting the DNN, wherein the appearance rate corresponds to a frequency of occurrence of each bit pattern within the plurality of weights, wherein the memory controller maps a bit pattern having a highest appearance rate to a resistance state level having a highest stability among the plurality of resistance state levels, and wherein the resistance state level having the highest stability corresponds to a resistance state level having a highest resistance value range.

2. The PCM-based memory device for DNN according to claim 1, wherein the memory controller maps a resistance state level with the highest stability to a resistance state level with the lowest stability among the plurality of resistance state levels of the memory cell, in order from a bit pattern with the highest appearance rate to a bit pattern with the lowest appearance rate among the bit patterns that appear by segmenting each of the total weights of the DNN into multi-bits.

3. The PCM-based memory device for DNN according to claim 1, wherein the memory controller distinguishes the bit patterns that appear by segmenting each of the total weights of the DNN into multi-bits, by bit position in the weights, and sequentially maps resistance state levels from a resistance state level having the highest stability to a resistance state level having the lowest stability among the plurality of resistance state levels of the memory cell, in order from a bit pattern with the highest appearance rate to a bit pattern with the lowest appearance rate in a bit pattern of the most significant bit position among bit patterns segmented by bit position.

4. The PCM-based memory device for DNN according to claim 1, wherein the memory controller distinguishes the bit patterns that appear by segmenting each of the total weights of the DNN into multi-bits, by bit position in the weights, maps a bit pattern with the highest appearance rate in the bit pattern of the most significant bit position among the bit patterns classified by bit position to a resistance state level with the highest stability among the plurality of resistance state levels of the memory cell, and sequentially maps a bit pattern with a high appearance rate among unmapped bit patterns in bit patterns of the next most significant bit position to a resistance state level with the next highest stability.

5. The PCM-based memory device for DNN according to claim 1, wherein the memory controller distinguishes weights for each of the plurality of layers of the DNN, and maps the bit patterns that appear by segmenting the distinguished weights of each layer into multi-bits to the resistance state levels independently for each layer, wherein the memory controller sequentially maps resistance state levels from a resistance state level having the highest stability to a resistance state level having the lowest stability among the plurality of resistance state levels of the memory cell in order from the bit pattern with the highest appearance rate to the bit pattern with the lowest appearance rate among the bit patterns.

6. The PCM-based memory device for DNN according to claim 1, wherein the memory controller distinguishes weights for each of the plurality of layers of the DNN, distinguishes the bit patterns that appear by segmenting the distinguished weights of each layer into multi-bits, by bit position in the weights, and maps the bit patterns to the resistance state levels independently for each layer, wherein the memory controller sequentially maps resistance state levels from a resistance state level having the highest stability to a resistance state level having the lowest stability among the plurality of resistance state levels of the memory cell, in order from a bit pattern with the highest appearance rate to a bit pattern with the lowest appearance rate in a bit pattern of the most significant bit position among bit patterns segmented by bit position.

7. The PCM-based memory device for DNN according to claim 1, wherein the memory controller distinguishes weights for each of the plurality of layers of the DNN, distinguishes the bit patterns that appear by segmenting the distinguished weights of each layer into multi-bits, by bit position in the weights, and maps the bit patterns to the resistance state levels independently for each layer, wherein the memory controller maps a bit pattern with the highest appearance rate in the bit pattern of the most significant bit position among the bit patterns classified by bit position to a resistance state level with the highest stability among the plurality of resistance state levels of the memory cell, and sequentially maps a bit pattern with a high appearance rate among unmapped bit patterns in bit patterns of the next most significant bit position to a resistance state level with the next highest stability.

8. The PCM-based memory device for DNN according to claim 1, wherein the memory controller receives a plurality of weights included in the plurality of layers of the DNN, as well as auxiliary bits indicating the appearance rate for each bit pattern of the plurality of weights, and maps the bit patterns and the resistance state levels based on the received auxiliary bits.

9. The PCM-based memory device for DNN according to claim 1, wherein the memory controller checks the resistance value of the memory cell, and, when a resistance state level including the checked resistance value is determined, converts the resistance value into multi-bit data and output it according to a mapping relationship between the bit patterns and the resistance state levels.

10. A method for storing weights of a phase change memory (PCM)-based memory device for deep neural network (DNN), in which the memory device comprises a memory controller and a cell array having a plurality of memory cells implemented with phase change memories, wherein each of the plurality of memory cells stores multi-bit data according to a resistance state level including a resistance value among a plurality of resistance state levels, the method comprising the steps of:

by the memory controller, mapping each bit pattern and the resistance state level, according to an appearance rate for bit patterns of a plurality of weights included in a plurality of layers constituting the DNN; and by the memory controller, storing the multi-bit data as a resistance value according to the mapped resistance state level of the memory cell, wherein the appearance rate corresponds to a frequency of occurrence of each bit pattern within the plurality of weights, wherein the mapping is performed such that a bit pattern with a highest appearance rate is mapped to a resistance state level having a highest stability, and wherein the resistance state level having the highest stability corresponds to a resistance state level having a highest resistance value range.

11. The method for storing weights of a PCM-based memory device for DNN according to claim 10, wherein the step of mapping includes sequentially mapping a resistance state with the highest stability to a resistance state level with the lowest stability among the plurality of resistance state levels of the memory cell, in order from a bit pattern with the highest appearance rate to a bit pattern with the lowest appearance rate among the bit patterns that appear by segmenting each of the total weights of the DNN into multi-bits.

12. The method for storing weights of a PCM-based memory device for DNN according to claim 10, wherein the step of mapping includes:

distinguishing the bit patterns that appear by segmenting each of the total weights of the DNN into multi-bits, by bit position in the weights, and sequentially mapping resistance state levels from a resistance state level having the highest stability to a resistance state level having the lowest stability among the plurality of resistance state levels of the memory cell, in order from a bit pattern with the highest appearance rate to a bit pattern with the lowest appearance rate in a bit pattern of the most significant bit position among bit patterns segmented by bit position.

13. The method for storing weights of a PCM-based memory device for DNN according to claim 1, wherein the step of mapping includes:

distinguishing the bit patterns that appear by segmenting each of the total weights of the DNN into multi-bits, by bit position in the weights, mapping a bit pattern with the highest appearance rate in the bit pattern of the most significant bit position among the bit patterns segmented by bit position to the resistance state level with the highest stability among the plurality of resistance state levels of the memory cell, and sequentially mapping a bit pattern with a high appearance rate among unmapped bit patterns in bit patterns of the next most significant bit position to a resistance state level with the next highest stability.

14. The method for storing weights of a PCM-based memory device for DNN according to claim 10, wherein the step of mapping includes:

distinguishing weights for each of the plurality of layers of the DNN, mapping the bit patterns that appear by segmenting the distinguished weights of each layer into multi-bits to the resistance state levels independently for each layer, and wherein resistance state levels from a resistance state level having the highest stability to a resistance state level having the lowest stability among the plurality of resistance state levels of the memory cell are sequentially mapped in order from the bit pattern with the highest appearance rate to the bit pattern with the lowest appearance rate among the bit patterns.

15. The method for storing weights of a PCM-based memory device for DNN according to claim 10, wherein the step of mapping includes:

distinguishing weights for each of the plurality of layers of the DNN, distinguishing the bit patterns that appear by segmenting the distinguished weights of each layer into multi-bits, by bit position in the weights, and mapping the bit patterns to the resistance state levels independently for each layer, wherein resistance state levels from a resistance state level having the highest stability to a resistance state level having the lowest stability among the plurality of resistance state levels of the memory cell are sequentially mapped in order from a bit pattern with the highest appearance rate to a bit pattern with the lowest appearance rate in a bit pattern of the most significant bit position among bit patterns segmented by bit position.

16. The method for storing weights of a PCM-based memory device for DNN according to claim 10, wherein the step of mapping includes:

distinguishing weights for each of the plurality of layers of the DNN, distinguishing the bit patterns that appear by segmenting the distinguished weights of each layer into multi-bits, by bit position in the weights, and mapping the bit patterns to the resistance state levels independently for each layer, wherein a bit pattern with the highest appearance rate in the bit patterns of the most significant bit position among the bit patterns segmented by bit position is mapped to a resistance state level with the highest stability among the plurality of resistance state levels of the memory cell, and a bit pattern with a high appearance rate among unmapped bit patterns in bit patterns of the next most significant bit position is sequentially mapped to a resistance state level with the next highest stability.

17. The method for storing weights of a PCM-based memory device for DNN according to claim 10, wherein the step of mapping includes:

receiving a plurality of weights included in the plurality of layers of the DNN, as well as auxiliary bits indicating the appearance rate for each bit pattern of the plurality of weights, and mapping the bit patterns and the resistance state levels based on the received auxiliary bits.

18. The method for storing weights of a PCM-based memory device for DNN according to claim 10, wherein the step of storing includes:

applying a voltage or current to a memory cell depending on a configuration of the memory device, so that the memory cell storing multi-bit data according to each bit pattern among the plurality of memory cells has a resistance value within the range of the mapped resistance state level.

* * * * *